US009559645B2

(12) United States Patent
Klugbauer-Heilmeier (10) Patent No.: US 9,559,645 B2
(45) Date of Patent: Jan. 31, 2017

(54) SWITCHED AMPLIFIER FOR A VARIABLE SUPPLY VOLTAGE (71) Applicant: HOCHSCHULE FUR ANGEWANDTE WISSENSCHAFTEN MUNCHEN, Munich (DE)

(72) Inventor: Josef Klugbauer-Heilmeier, Freising (DE)

(73) Assignee: HOCHSCHULE FÜR ANGEWANDTE WISSENSCHAFTEN MÜNCHEN, Munich (DE)

( * ) Notice: Subject to any disclaimer, the term of this patent is extended or adjusted under 35 U.S.C. 154(b) by 123 days.

(21) Appl. No.: 14/402,944

(22) PCT Filed: May 3, 2013

(86) PCT No.: PCT/EP2013/001323
§ 371 (c)(1),
(2) Date: Apr. 27, 2015

(87) PCT Pub. No.: WO2013/174476
PCT Pub. Date: Nov. 28, 2013

(65) Prior Publication Data
US 2015/0236660 A1    Aug. 20, 2015

(30) Foreign Application Priority Data

May 24, 2012 (DE) .................. 10 2012 104 488

(51) Int. Cl.
*H03F 3/38* (2006.01)
*H03F 3/217* (2006.01)
*H04R 3/00* (2006.01)

(52) U.S. Cl.
CPC ............ *H03F 3/217* (2013.01); *H03F 3/2171* (2013.01); *H04R 3/00* (2013.01); *H03F 2200/03* (2013.01); *H03F 2200/504* (2013.01)

(58) Field of Classification Search
CPC .... H03F 3/2171; H03F 3/2173; H03F 3/2175; H03F 3/38
(Continued)

(56) References Cited

U.S. PATENT DOCUMENTS 5,262,733 A    11/1993 Nakajima et al.
5,345,165 A     9/1994 Froeschle
(Continued)

FOREIGN PATENT DOCUMENTS

DE    10 2004 060 632 A1    8/2005
EP         0 184 280 A1    6/1986
(Continued)

OTHER PUBLICATIONS

Office Action in International Application No. DE 10 2012 104 488.0, dated Mar. 26, 2013, 4 pages.
(Continued)

*Primary Examiner* — Steven J Mottola
(74) *Attorney, Agent, or Firm* — Brinks Gilson & Lione (57) ABSTRACT

The amplifier according to the present invention serves to amplify an input signal to an output signal and includes a signal path and a negative feedback connection. The signal path includes a modulator which is suitable for receiving the input signal and for generating a switching signal in response to the received input signal. The signal path further includes a switched output stage, which is connected to a supply voltage, wherein the switched output stage contains a switch that is switched according to the switching signal generated by the modulator, wherein the switched output stage generates an output signal the amplitude of which depends on the supply voltage.

19 Claims, 3 Drawing Sheets

(58) Field of Classification Search
USPC .................................... 330/10, 207 A, 251
See application file for complete search history.

(56) References Cited

U.S. PATENT DOCUMENTS

| | | | |
|---|---|---|---|
| 6,552,606 B1 | 4/2003 | Veltman et al. | |
| 6,741,123 B1 | 5/2004 | Andersen et al. | |
| 6,765,436 B1 | 7/2004 | Melanson et al. | |
| 7,161,421 B2 | 1/2007 | Honda | |
| 7,840,015 B1 | 11/2010 | Melanson et al. | |
| 9,036,836 B2 * | 5/2015 | Zhang ................ | H03F 3/2173 330/10 |
| 2004/0222846 A1 | 11/2004 | Melanson et al. | |
| 2005/0127991 A1 | 6/2005 | Honda | |
| 2005/0200404 A1 | 9/2005 | Bernardon | |
| 2006/0091945 A1 | 5/2006 | Wegner | |
| 2006/0208794 A1 | 9/2006 | Morishima | |
| 2007/0152750 A1 | 7/2007 | Andersen et al. | |
| 2008/0042746 A1 | 2/2008 | Kozak et al. | |
| 2009/0027117 A1 | 1/2009 | Andersen et al. | |
| 2009/0091382 A1 | 4/2009 | Determan | |
| 2011/0075723 A1 | 3/2011 | Melanson et al. | |
| 2012/0099743 A1 | 4/2012 | Ozaki | |

FOREIGN PATENT DOCUMENTS

| | | | |
|---|---|---|---|
| EP | 0 503 571 A1 | 9/1992 | |
| JP | WO 2011161911 A1 * | 12/2011 | ........... H03F 3/2173 |
| WO | WO 00/42702 A1 | 7/2000 | |
| WO | WO 2004/023631 A2 | 3/2004 | |
| WO | WO 2004/023645 A2 | 3/2004 | |

OTHER PUBLICATIONS

International Search Report in International Application No. PCT/EP2013/001323, dated Sep. 24, 2013, 5 pages.

* cited by examiner

SWITCHED AMPLIFIER FOR A VARIABLE SUPPLY VOLTAGE

Applicants claim, under 35 U.S.C. §§120 and 365, the benefit of priority of the filing date of May 3, 2013, of a Patent Cooperation Treaty patent application, copy attached, Serial Number PCT/EP2013/001323, filed on the aforementioned date, the entire contents of which are incorporated herein by reference, wherein Patent Cooperation Treaty patent application Serial Number PCT/EP2013/001323 was not published under PCT Article 21(2) in English.

Applicants claim, under 35 U.S.C. §119, the benefit of priority of the filing date of May 24, 2012 of a German patent application, copy attached, Serial Number 10 2012 104 488.0 filed on the aforementioned date, the entire contents of which is incorporated herein by reference.

FIELD OF THE INVENTION

The present invention relates to the field of audio engineering. Specifically, it relates to a switched amplifier which is suitable for energy-efficient operation, as well as to a method for the energy-efficient amplification of audio signals.

RELATED STATE OF THE ART

The amplification of audio signals in audio engineering is based on electronic power amplifiers, The amplified audio signals are converted into a sound signal which can then be perceived by a user. Such electronic power amplifiers are used in commonly known devices of consumer electronics such as CD-players and television sets.

A class of amplifiers in widespread use are so-called class D amplifiers, which include a modulator and a switched output stage. Such class D amplifiers are characterised in that the switched output stage includes switches which assume only two discrete switching states and which are—as is the case with other amplifiers—continuously set to the right recording level. As a result, these switched amplifiers include a comparatively high degree of efficiency. Due to their high efficiency switched amplifiers are used, in particular, in the professional field, where a higher performance is often needed. As an example, we would mention electronic systems such as used for loudspeaker systems at airports or in shopping centers for loudspeaker announcements.

Control of the switches in the switched output stage is effected via a switching signal which is provided by the modulator in response to the audio signal to be amplified. The modulation process used for such class D amplifiers is frequently the sigma-delta-modulation, where a switching signal, which may be a binary or ternary signal, is generated from an analog or digital input signal.

An example for such a class D amplifier is described in the patent specification US 2008/0042746 A1. This includes a sigma-delta-modulator, a switched output stage and a negative feedback connection, which allows for the suppression of noise in the signal path. The output signal of the switched output stage is generated based on the switching operations in the switched output stage. Switching losses which result from the switched output stage are proportional to the square of the supply voltage applied at the switched output stage. Depending on the level of the applied voltage the switching losses are correspondingly high. This has a negative effect, in particular for weak input signals, upon the energy efficiency of the amplifier.

A further example for a class D amplifier is described in the patent specification US2006/0091945 A1. This class D amplifier operates according to the principle of error correction. Errors occurring at the switched output stage as a result of errors in the supply voltage are minimised by dividing the signal in the signal path outside a negative feedback connection by a digital supply voltage value.

SUMMARY OF THE INVENTION

The problem underlying the present invention is to provide an amplifier, which can work in a more energy-efficient manner than is usual in the state of the art. Furthermore, a method is to be provided which allows for an energy-efficient amplification of audio signals.

This problem is solved by an amplifier according to the present invention and by a method according to the present invention.

The amplifier according to the present invention serves to amplify an input signal to an output signal and includes a signal path and a negative feedback connection. The signal path includes a modulator which is suitable for receiving the input signal and for generating a switching signal in response to the received input signal. The signal path further includes a switched output stage, which is connected to a supply voltage, wherein the switched output stage contains a switch that is switched according to the switching signal generated by the modulator, wherein the switched output stage generates an output signal the amplitude of which depends on the supply voltage, The negative feedback connection is suitable for feeding back the output signal of the switched output stage, in order to be combined with the input signal. The signal path and the negative feedback connection form a loop with a loop gain.

Finally, the amplifier includes a compensator which receives the supply voltage of the switched output stage or a signal derived therefrom, and which is suitable for compensating, at least partially, for changes in the loop gain which result from a variation in the supply voltage.

Known amplifiers which include a switched output stage, modulator, and a negative feedback connection are operated at a constant or essentially constant supply voltage. Even for small amplitudes of the input signal, the entire supply voltage is applied to the switched output stage, the switch of which continues to be switched at a certain switching frequency. The mean amplitude of the output signal is determined by the sequence and the sign of the pulses in the output signal. The amplitude of the pulses in the output signal is essentially constant and dependent on the supply voltage, but independent of the amplitude of the input signal. Switching losses resulting from the switching of the switch and increasing with the square of the supply voltage are, with known amplifiers, essentially independent of the amplitude of the input signal. Thus, even when idling or when in standby mode, i.e., when no input signal is present or the input signal present has an amplitude of essentially zero, switching losses occur which correspond to those switching losses which occur for input signals with a maximum amplitude. For small amplitudes of the input signal the efficiency losses of these amplifiers are therefore relatively high.

When for known switched amplifiers which comprise a negative feedback connection and thus a loop with a loop gain the supply voltage is varied, the overall gain can be kept essentially constant under certain circumstances due to the negative feedback connection. Although admittedly the variation in the supply voltage also leads to a variation in the loop gain, which depending on the operating state of the amplifier may lead to instability as a consequence. Thus, known switched amplifiers can only be operated stable at an essentially constant supply voltage.

In contrast thereto, the amplifier according to the present invention is suitable for being operated with a variable supply voltage, and in particular is suitable for a more energy-efficient operation than is usual in the state of the art. The amplifier according to the present invention solves the above problem with the aid of a compensator which receives the supply voltage of the switched output stage or a signal derived therefrom and which is suitable to at least partially compensate for variations in the loop gain resulting from a variation in the supply voltage.

Due to the compensator the loop gain is kept essentially constant in the amplifier according to the invention even if the supply voltage varies. As a result, the amplifier can be operated independently of the supply voltage applied to the switched output stage, in a stable manner with high loop gain.

The amplifier according to the present invention is thus suitable for use with a supply voltage, which is adapted to the amplitude of the input signal. For example, for maximum input signals the maximum supply voltage may be applied to the switched output stage, and for minimum input signals or when in standby mode, a minimum supply voltage or a supply voltage of zero may be applied. Here, the adaptation of the mean amplitude of the output signal does not consist, or not consist exclusively, in the adaptation of the sequence and/or sign of the pulses in the output signal, but predominantly in the adaptation of the amplitude of the pulses in the output signal. For small amplitudes in the input signal the amplitudes of the pulses in the output signal are also small or vice versa. Since the switching losses scale with the square of the supply voltage or with the square of the amplitude of the pulses in the output signal, switching losses can be considerably reduced. Unnecessarily high efficiency losses for small amplitudes of the input signal can therefore be avoided with the aid of the amplifier according to the invention.

However, it is not necessary for the operation of the amplifier according to the present invention, to adapt the supply voltage to the amplitude of the input signal. Rather, it is possible to operate the amplifier according to the present invention with a wide spectrum of supply voltages without an additional adaptation having to be carried out, because the stable operation of the amplifier is ensured due to the compensator In this way the amplifier of the invention can be used universally.

An advantageous further development of the amplifier includes varying the supply voltage in dependence of the input signal. Varying is effected in that for small amplitudes of the input signal the supply voltage is decreased and in that for comparably large amplitudes of the input signal the supply voltage is increased correspondingly.

Preferably, the compensator is suitable for amplifying or reducing the signal in the signal path section of the loop in dependence of the supply voltage in a way that counteracts variations of the loop gain caused by variations of the supply voltage. Since signal amplifications carried out on the signal path section in the loop affect both the loop gain and the forward gain to the same extent, the overall gain due to this change is not or only negligibly altered.

In principle. there are various possibilities of technically realising the amplification in the signal path for the purpose of the compensation. In one particularly advantageous embodiment, the amplifier includes an additional modulator negative feedback connection in order to feed back the switching signal to an input of the modulator, and in order to combine the fed-back signal with the signal at the input of the modulator. In this case, the signal on the modulator negative feedback connection can be amplified or reduced with the aid of the compensator or in dependence of the supply voltage, in such a way that the change in loop gain is counteracted based on the variation in supply voltage.

Amplification or reduction of the signal on the modulator negative feedback connection preferably consists in multiplication with the supply voltage or with a signal which is derived therefrom. A signal multiplication in the modulator negative feedback connection functionally corresponds to a signal division in forward direction of the signal path. The forward direction is that direction in which the signal progresses from the amplifier input to the amplifier output without being fed back on a negative feedback connection. Signal multiplication compared to signal division has the advantage that it is technically easier to realise.

Preferably, the compensator includes a multiplexer for signal multiplication on the modulator negative feedback connection. The multiplexer has a first input for the switching signal and a second input for the supply voltage or for a signal derived therefrom. The multiplexer is controlled by the fed-back signal and generates an output signal in response to the switching signal. For example, the switching signal may be a binary signal which includes a first value and a second value, wherein the output signal for the first value corresponds to the value of the supply voltage or to a value which is derived from the supply voltage. For the second value, of the switching signal, the output signal corresponds to the corresponding inverted value.

The switching signal may also be a ternary signal. In this case the output signal of the multiplexer includes three values. For example, the output signal of the multiplexer comprises the value of the supply voltage or a value derived from the supply voltage, the correspondingly inverted value and the value of zero.

The modulator of the amplifier preferably includes a sigma-delta-modulator of the second order. The higher the order of the sigma-delta-modulator the better the noise generated in the modulator can be suppressed. On the other hand, with a rising order, stabilisation of the sigma-delta-modulator becomes more difficult. The phase-shift of the fed-back signal for a sigma-delta-modulator of a higher order compared to a sigma-delta-modulator of the first order, is raised by a factor which corresponds to the order of the sigma-delta-modulator. It has been found that a sigma-delta-modulator of the second order represents a good compromise between phase-shift and noise suppression.

The loop filter of the sigma-delta-modulator may, for example, includes integrators and/or resonators and it has a high amplification for the frequencies to be amplified in the audio range between 0-20 kHz and an amplification of one or less for frequencies outside this range. The state variables of this loop filter, as for example the output signals of the integrators, comprise a saturation behaviour which depends on the value of the signal fed back on the modulator negative feedback connection. In order to ensure that the sigma-delta-modulator remains stable in all operating states, the state variables of the loop filter must include a defined saturation behaviour. This is preferably achieved in that the limit values or saturation values of the state variables are correspondingly adapted with the aid of the compensation means in response to the variation in the supply voltage. The number of state variables of the loop filter corresponds to the order of the loop filter which order matches the number of integrators of the loop filter.

Preferably, the sigma-delta-modulator is a digital sigma-delta-modulator which is implemented on a hardware-programmable component, in particular on a FPGA (field programmable gate array). The described invention offers advantages, in particular when realised on a FPGA. However, the present invention can also be realised with the aid of an integrated circuit, in particular an ASIC (application-specific integrated circuit).

Furthermore, a digital loop filter is preferably arranged in the signal path upstream of the sigma-delta-modulator of the amplifier according to the present invention, which is suitable to receive the input signal, which was combined with the feedback signal from the negative feedback connection. Preferably, the digital loop filter—in the same way as the sigma-delta-modulator—is implemented on the hardware-programmable component, in particular on the FPGA. The digital loop filter leads to a high loop gain for the frequencies to be amplified so that noises can be effectively suppressed with the aid of negative feedback.

Preferably the negative feedback connection of the amplifier further includes an analog loop filter and a first analog-digital converter, in particular an analog-digital converter of the second order, the input of which is connected with the output of the analog loop filter. With the aid of the analog-digital converter the output signal of the analog loop filter is digitised and forwarded to the FPGA.

Further, the output signal of the first analog-digital converter is preferably fed back via a digital-analog negative feedback connection in order to be combined with the fed-back output signal of the switched output stage. The digital-analog negative feedback connection has a digital-analog converter arranged in it, which is suitable for converting the fed-back output signal of the first analog-digital converter into an analog signal, before this is combined with the analog output signal of the switched output stage, which was fed back via the negative feedback connection.

Preferably, 1-bit converters are used for the first analog-digital converter and for the digital-analog converter. Due to using the analog loop filter which typically has a high loop gain in the audio range, the first analog-digital converter may be a simple low-cost 1-bit analog-digital converter.

Alternatively, for example in case of higher-quality demands, the first analog-digital converter and the digital-analog converter may be converters with more than 1-bit word width. In this case, a digital filter is preferably arranged downstream of the first analog-digital converter, the output signal of which is then fed back via the digital-analog negative feedback connection. The digital filter can be of help in reducing high-frequency signal components. The analog loop filter, the first analog-digital converter, the digital filter, the digital-analog converter and the digital-analog negative feedback connection together form a low-cost converter for the fed-back output signal of the switched output stage.

In order to smooth the output signal of the switched output stage the amplifier preferably includes a filter which is arranged in the signal path in downstream direction of the switched output stage. On the output side, the negative feedback connection is connected with the signal path after the output of the switched output stage and before the input of the filter. Alternatively, the negative feedback connection can be connected with the signal path after the output of the filter. The negative feedback connection is thus suitable for feeding back the output signal of the switched output stage upstream or downstream of the filter.

Preferably, the amplifier includes a second analog-digital converter which is suitable to convert the supply voltage into a digital signal and to forward it to the compensator. Thus, the at least partial compensation of changes in the loop gain which result from a variation in the supply voltage can be effected digitally on the FPGA. This signal is an example for a signal mentioned in the beginning which is "derived" from the supply voltage.

Preferably, the amplifier contains a connection for the supply voltage which is made available via a network component, which, in one embodiment of the present invention, is not part of the amplifier as such. The supply voltage is provided external to the amplifier and connected to the connection of the amplifier provided for this purpose.

The switched output stage of the amplifier is preferably formed by an H bridge. The switch of the amplifier preferably consists of power MOSFET transistors which are switched by the switching signal.

For digital signal processing and digital signal generation, the amplifier preferably includes a clock source. For the operation of the first analog-digital converter this clock source preferably provides a sampling frequency of $\geq 100$ kHz, preferably $\geq 1$ MHz, more preferably $\geq 10$ MHz. The different required clock frequencies can be provided directly by the clock source or can be derived from the clock source in the FPGA.

In an alternative embodiment of the amplifier according to the present invention, the compensator is suitable for increasing or decreasing the signal on the negative feedback connection in dependence of the supply voltage in such a way that it counteracts the change in loop gain based on a variation in the supply voltage. When interfering with the negative feedback connection the change only affects the loop gain, but not the forward gain. In order to counteract a resulting change in overall gain the signal on the signal path in a section outside the said loop is additionally appropriately increased or decreased with the aid of the compensation means, by which only the forward gain, but not the loop gain is altered. In this way it is possible to properly compensate for the first-mentioned change in overall gain.

In an alternative embodiment the increase or decrease of the signal on the negative feedback connection is preferably effected with the aid of the compensator via a multiplication with the supply voltage of the switched output stage or with a signal derived therefrom.

In a second alternative embodiment of the amplifier according to the present invention, the compensator is suitable for dividing the signal on the signal path in the loop by the supply voltage of the switched output stage or by a signal derived therefrom. The division on the signal path in the loop changes the forward gain to the same extent as the loop gain so that the overall gain remains essentially unchanged.

Furthermore, the present invention relates to a method for amplifying an input signal to an output signal with the aid of an amplifier comprising a signal path and a negative feedback connection, which form a loop with the loop gain, wherein the method includes:
  receiving the input signal,
  generating a switching signal with the aid of a modulator,
  generating an output signal with the aid of a switched
    output stage connected with a supply voltage, wherein
    the switched output stage contains a switch which is
    switched corresponding to the switching signal generated by the modulator, wherein the amplitude of the output signal depends on the supply voltage, feeding the output signal of the switched output stage back with the aid of the negative feedback connection, combining the fed-back output signal with the input signal, compensating, at least partially, for changes in loop gain resulting from a variation in the supply voltage, by using a compensator, wherein the compensator receives the supply voltage of the switched output stage or a signal derived therefrom.

Preferably, the method is executed by an amplifier according to one of the above-mentioned embodiments.

SHORT DESCRIPTION OF THE FIGURES

Further advantages and features of the present invention are revealed in the description below, in which the present invention is explained in detail by way of preferred exemplary embodiments with reference to the attached figures, in which.

DESCRIPTION OF THE PREFERRED EMBODIMENT

Figure 1:
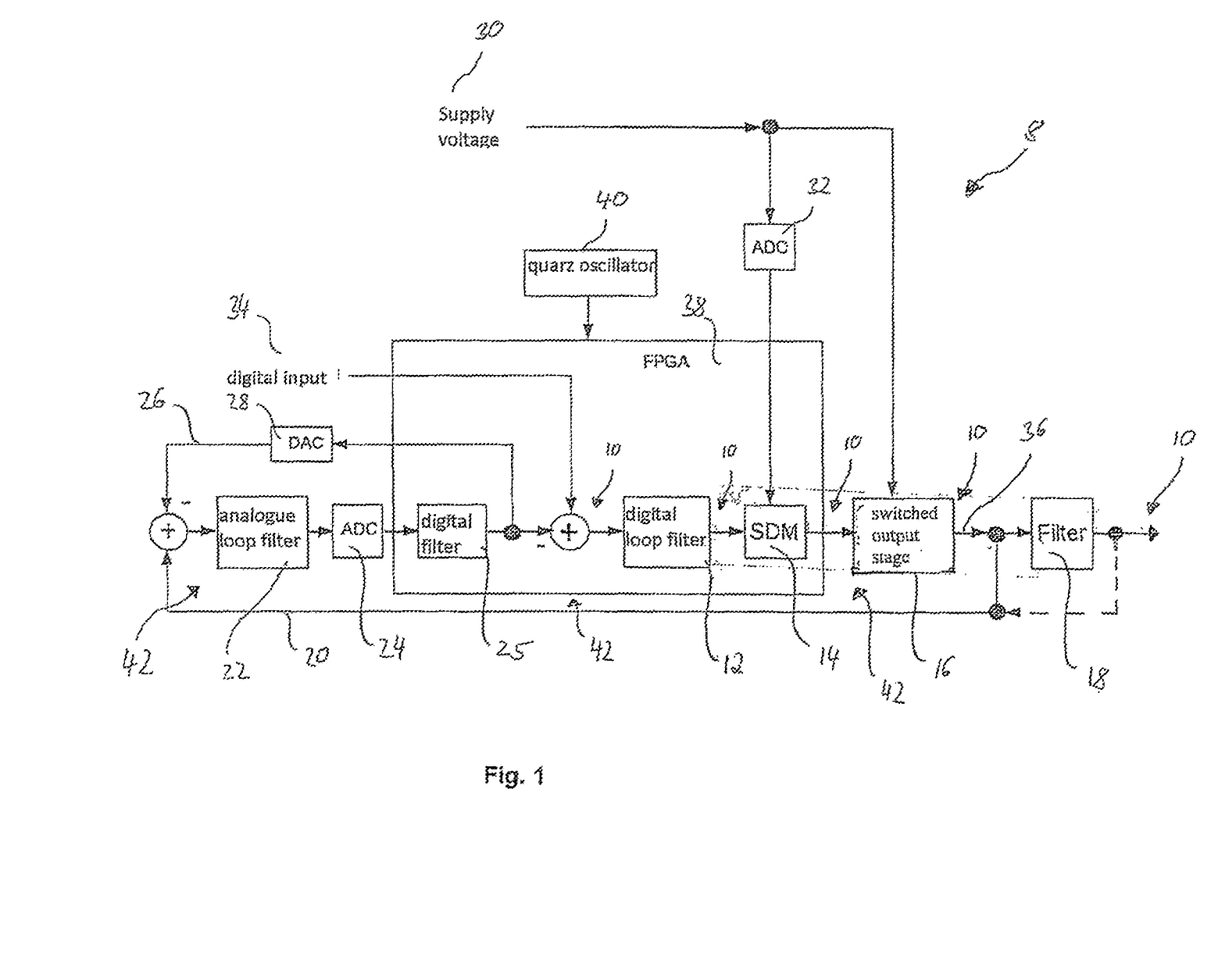
FIG. 1 shows a block circuit diagram of the amplifier according to the present invention with a digital loop filter and a digital sigma-delta-modulator.

FIG. 1 shows an exemplary embodiment of the amplifier 8 according to the present invention. This includes a signal path 10 in which are consecutively arranged in forward or downstream direction: a digital loop filter 12, a digital sigma-delta-modulator 14, a switched output stage 16 and a filter 18. The switched output stage 16 is formed by an H-bridge. Furthermore, a negative feedback connection 20 is depicted, which at its input is connected with the signal path 10 between the switched output stage 16 and the filter 18 or alternatively with the signal path 10 behind the filter 18. Further, an analog loop filter 22, a first analog-digital converter 24 and a digital filter 25 are consecutively arranged in signal direction in the negative feedback connection 20. A digital-analog negative feedback connection 26 is connected, at its input, with the output of the digital filter 25 and, at its output, with the input of the analog loop filter 22. The digital-analog negative feedback connection 26 also includes a digital-analog converter 28. The amplifier 8 is operated with a supply voltage 30, which may be variable, and which may be connected with the switched output stage 16 and, via a second analog-digital converter 32, with the digital sigma-delta-modulator 14. A digital input forms the input of the signal path 10, on which, after the switched output stage 16, the output signal 36 is provided. The digital loop filter 12, the sigma-delta-modulator 14 and the digital filter 25 are implemented on the hardware-programmable component 38 which includes a FPGA and which is connected with a clock source 40. The negative feedback connection 20 and the signal path 10 together form a loop 42.

The analog output signal 36 of the switched output stage 16 or alternatively the output signal is fed back downstream of the filter 18 via the negative feedback connection 20 in order to he combined with the input signal. The combination is typically carried out in that the fed-back signal, which is phase-shifted by 180° to the input signal, is added to the input signal. This corresponds to a signal subtraction. Noise effects which arise on the signal path 10 within the loop 42 are eliminated or at least suppressed with the aid of the negative feedback. An example for such a noise effect is a non-linear behaviour in the switched output stage 16, which leads to sound distortions.

Before the fed-back signal is combined with the input signal, it is amplified with the aid of the analog loop filter 22 and subsequently digitised with the aid of the first analog-digital converter 24. Furthermore, high-frequency signal portions in the digitised signal are reduced with the aid of the digital filter 25, after the first analog-digital converter 24. The first analog-digital converter 24 is preferably a sigma-delta-modulator of the second order, which is preferably operated at a clock frequency >10 MHz.

The input signal combined with the fed-back output signal is amplified by the digital loop filter 12 for the required frequency range, and for higher frequencies above this frequency range, is forwarded unamplified or attenuated to the digital sigma-delta-modulator 14.

The output signal of the digital filter 25 is fed back with the aid of the digital-analog negative feedback connection 26 in order to be combined with the fed-back output signal 36 of the switched output stage 16. Prior to combining the digital output signal of the digital filter 25, this is converted into an analog signal with the aid of the digital-analog converter 28. In the same way as the first analog-digital converter 24 the digital-analog converter 28 is also operated at a clock frequency of >10 MHz. Due to the use of a clock frequency of >10 MHz no errors or only very few errors arise during conversion between digital and analog signals so that no aliasing filtering or only a very simple aliasing filtering is necessary, which is normally used to diminish effects which arise due to an insufficient clock frequency during conversion between digital and analog signals (so-called alias effects).

In response to the output signal of the digital loop filter 12, the sigma-delta-modulator 14 generates a switching signal which is a digital signal able to assume the values "0" and "1", for example.

The switching signal is received by the switched output stage 16 which generates the output signal 36 in response to the switching signal. The switched output stage 16 contains a switch which is switched in dependence of the switching signal and assumes one of two discrete switching states. The switch of the switched output stage 16 may, for example, take the form of power MOSFET transistors. When controlling the switching means the signal value "0" of the switching signal corresponds to a "closed" switching state, and the signal value "1" of the switching signal corresponds to an "open" switching state or vice versa, depending on the respective switching means under consideration. Thus, the switch of the switched output stage 16 is switched in response to the switching signal and individual pulses are generated in the output signal in response to the switching operations. The amplitude and the sign of the pulses in the output signal 36 depend on the value of the applied supply voltage 30 and the value of the switching signal. For example, a pulse or pulse contribution is generated in the output signal 36 for the value "1" of the switching signal, which corresponds to the supply voltage 30. A correspondingly inverted pulse or pulse contribution is then generated in the output signal 36 for the value "0" of the switching signal. Thus the output signal 36 also corresponding to the two signal values of the switching signal—includes two discrete values, the amount of which depends on the supply voltage 30 applied to the switched output stage 16.

Amplification of the input signal by the amplifiers 8 to the output signal 36 is effected such that the mean amplitude of the output signal 36 essentially corresponds to the mean amplitude of the input signal, amplified by a certain factor. If the output signal 36, over a time section of a certain length, contains only positive pulses or only negative pulses, then the mean amplitude of the output signal 36 over this time section assumes its maximum or minimum value for the applied supply voltage 30, respectively. This is called a 100% positive or a 100% negative output coupling, respectively. If the output signal 36, over a time section of a certain length, contains approx. the same number of positive and negative pulses, then the mean amplitude or the output signal 36 over this time section assumes a value of zero. In this case, the output coupling amounts to 0%. The mean amplitude of the output signal 36 is thus determined by the degree of output coupling and the applied supply voltage 30. The degree of output coupling is determined by that switching signal which is generated with the aid of the digital sigma-delta-modulator 14 in answer to the input signal.

It can be recognised that for weak input signals there will be a comparatively low output coupling in order to generate the corresponding comparatively low mean amplitude of the output signal 36. This means, however, that in this case the supply voltage 30 of the switched output stage 16 is higher than really necessary. At the same time high supply voltages 36 for weak input signals represent a problem with regard to energy efficiency because the switching losses of the switched output stage 16 increase/decrease to the square of the supply voltage 30.

Energy efficiency can be improved if the supply voltage 30—for an unchanged overall gain—can be adapted to the input signal so that for weaker input signals unnecessarily high supply voltages 30 can be avoided.

The construction shown favours such a functionality because the overall gain due to the negative feedback connection 20 is essentially independent of the supply voltage 30. Admittedly, the change in the supply voltage 30 which will be explained in detail further below leads to a change in loop gain which in turn leads to an instability in the negative feedback. The present invention therefore proposes to compensate in a suitable manner for changes in the loop gain resulting from the variation in supply voltage 30 as it is possible in terms of the invention and thereby ensuring the stability of the negative feedback. This will now be explained in detail.

The overall gain $A_G$, with which the input signal is amplified to the output signal, results from the forward gain $A_V$ and the loop gain $A_S$ based on the following formula:

$$A_G = \frac{A_V}{1+A_S}$$

The loop gain $A_S$ is that gain, with which a signal is amplified in a single round trip through the loop 42, and the forward gain $A_V$ is that gain with which the input signal would be amplified without negative feedback to the output signal 36. For the audio range from 0 to 10 kHz the amplifier according to the invention preferably comprises a loop gain of ≥30 dB, preferably ≥40 dB and especially preferably ≥50 dB.

Due to the negative feedback, the overall gain $A_G$ which without negative feedback would correspond to the forward gain $A_V$ is reduced by the factor $(1+A_S)^{-1}$ whereby the amplification behaviour is linearized and stabilized at the expense of the overall gain $A_G$.

Since the switched output stage 16 is situated in the signal path 10 inside the loop 42, both the loop gain $A_S$ and the forward gain $A_V$ are proportional to the applied supply voltage. I.e.

$$A_S = K_U \cdot A_{SU} \text{ and}$$

$$A_V = K_U \cdot A_{VU},$$

wherein $K_U$ is the proportionality factor dependent on the supply voltage 30, and wherein $A_{SU}$ or $A_{VU}$ is the percentage of the loop or forward gain, which does not vary with the supply voltage 30.

Since both the forward gain $A_V$ and the loop gain $A_S$ for the input signal to be amplified are essentially greater than One ($A_V$, $A_S$) >>1, the overall gain $A_G$ approximately corresponds to the quotient g from the forward gain $A_V$ and the loop gain $A_S$, which quotient is independent of the applied supply voltage 30:

$$A_G = \frac{A_V}{1+A_S} = \frac{K_U \cdot A_{VU}}{1+K_U \cdot A_{SU}} \approx g$$

Therefore, also in case of a variation in the supply voltage 30 due to the negative feedback connection 20, the overall gain $A_G$, with which the input signal is amplified to the output signal 36, remains essentially unchanged. For a reduced supply voltage 30, the loop gain $A_S$ and the forward gain $A_V$ are also reduced so that the overall gain $A_G$ is essentially maintained. The degree of output coupling is automatically raised accordingly.

For an energy-efficient operation, the supply voltage 30 can be adapted for weak input signals thereby maintaining the degree of output coupling.

With known switched amplifiers with negative feedback the loop gain $A_S$ would change for a variation in supply voltage 30. However, for certain signal frequencies this would lead to a phase shift of the fed-back output signal and thus to instability of the amplifier.

In order to counteract this instability, the amplifier 8 according to the present invention includes a compensator that receives the supply voltage 30 applied to the switched output stage 16 or a signal derived therefrom and which is suitable for compensating at least partially for changes in the loop gain, which results from a variation in the supply voltage 30.

In a preferred embodiment of the amplifier 8, according to the present invention, the at least partial compensation for a change in the loop gain $A_S$ is effected in the sigma-delta-modulator 14. This is shown in FIG. 2.

Figure 2:
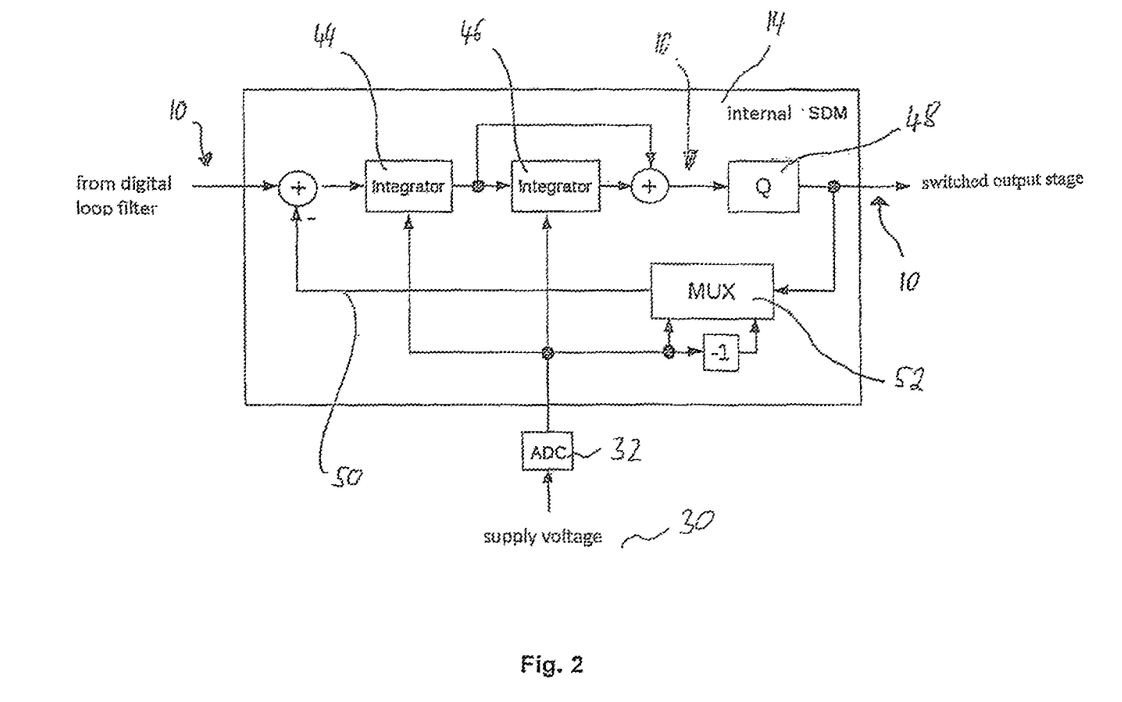
FIG. 2 shows a block circuit diagram of the internal sigma-delta-modulator.

FIG. 2 shows the sigma-delta-modulator 14, through which the signal path 10 passes. The signal path 10 within the sigma-delta-modulator 14 has a first integrator 44, a second integrator 46 and a quantizer 48 consecutively arranged in it. Furthermore, the sigma-delta-modulator 14 includes a modulator negative feedback connection 50 which in the present description is considered as part of the signal path and on which a multiplexer 52 is arranged. Furthermore, FIG. 2 shows the second analog-digital converter 32 which receives the supply voltage 30 and which is connected with the first and the second integrator 44 and 46 and additionally with the multiplexer 52.

With the aid of the modulator negative feedback connection 50, the switching signal is fed back from the output of the sigma-delta-modulator 14 and then multiplied with a digital signal derived from the supply voltage 30, which is generated with the aid of the second analog-digital converter 32. Signal multiplication with the aid of the multiplexer 52 is effected such that the multiplexer 52 is switched with the aid of the switching signal, including, for example, the values "0" or "1", and which thus in response to the switching signal provides the value or the inverted value of the digital signal which is derived from the supply voltage 30. The signal thus provided by the multiplexer 52 is fed back via the modulator negative feedback connection 50 and combined with the output signal of the digital loop filter 12. The signal multiplication with the signal derived from the supply voltage 30 in the modulator negative feedback connection 50 effectively corresponds to a signal division in forward direction of the signal path 10. The signal direction of the modulator negative feedback connection 50 corresponds to the reverse direction of the signal path 10. Due to this division, the change in loop gain proportional to the supply voltage 30 which results at the switched output stage 16 for a variation in the supply voltage 30 is at least partially compensated for. Thus, a costly signal division is replaced by a signal multiplication, which is much simpler to execute and which in addition, due to a binary or ternary switching signal, merely consists of multiplexing with the aid of the multiplexer 52.

In order to ensure that the sigma-delta-modulator 14 remains stable, the state variables of the first and second integrators 44 and 46 are adapted. This will now be explained by way of FIG. 3.

Figure 3:
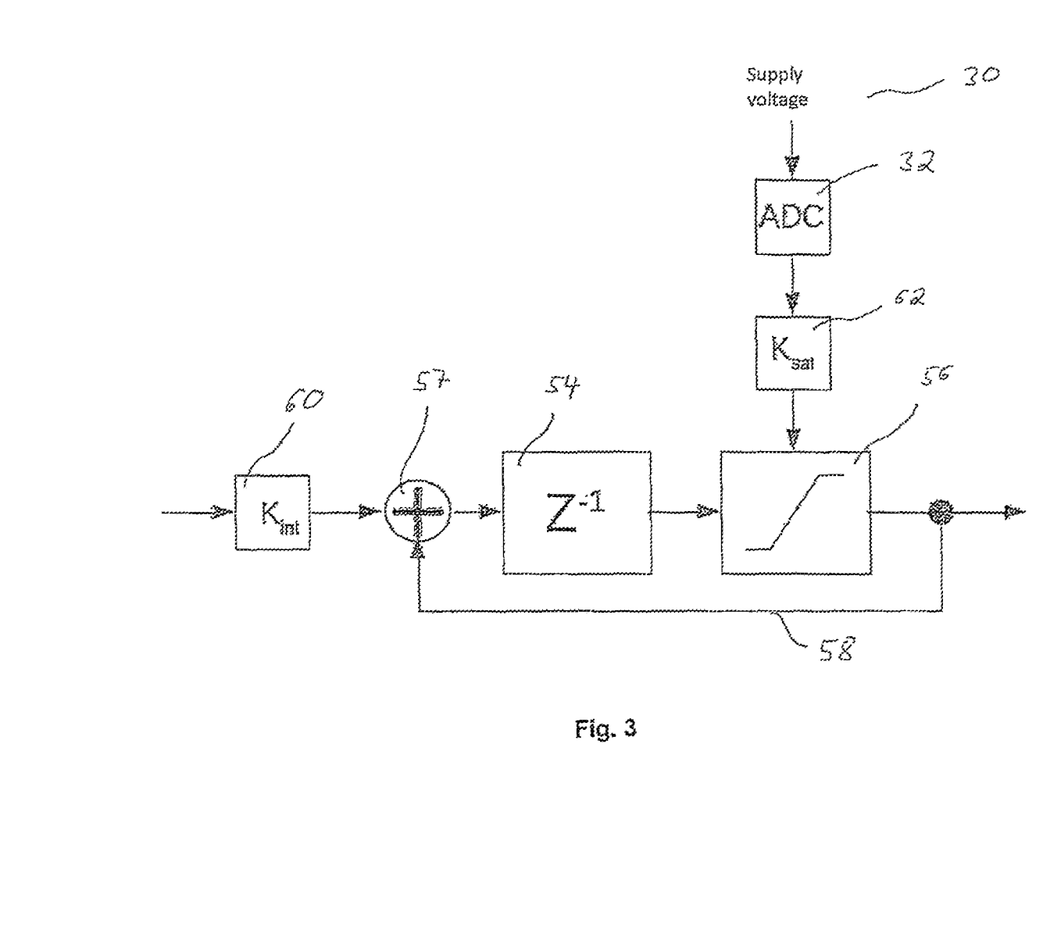
FIG. 3 shows a block circuit diagram of a digital integrator with adapted saturation.

FIG. 3 shows the block circuit diagram of a digital integrator which for example could be used as first and second integrators 44 and 46, and which are implemented on the hardware-programmable component 38, in particular on the FPGA. FIG. 3 shows the supply voltage 30 connected with the second analog-digital converter 32 and the digital integrator including a delay element 54, an integrator saturation 56, an adder 57 and an integrator feedback 58. An integration coefficient 60 is present at the input of the digital integrator. The integrator saturation 56 is determined by a saturation value 62.

The integrator increases its output value which is fed back to the adder 57 via the integrator feedback 58, with each clock cycle by the integrator input value multiplied with the integration coefficient 60. The integrator saturation 56 ensures that the output value of the integrator does not exceed the saturation value 62. To ensure the stability of the sigma-delta-modulator 14, it is necessary for the state variables of the first and second integrators 44 and 46 to include a defined saturation behaviour independent of the supply voltage 30. Since the signal fed back on the modulator negative feedback connection 50 changes in dependence of the supply voltage 30, the integrator input value also changes in dependence of the supply voltage 30 and thus saturation occurs in dependence of the supply voltage 30. In order to ensure that the saturation behaviour of the first and second integrators 44 and 46 remains defined also for a variation in the supply voltage 30, the saturation values 62 of the first and second integrators 44 and 46 are adapted in accordance with the variation in the supply voltage 30. Thus, the stability of the sigma-delta-modulator 14 is ensured also for a variation in the supply voltage 30.

The amplifier described in FIG. 1, and in particular in FIGS. 2 and 3, represents a particularly advantageous embodiment of the present invention, because signal adaption is carried out via signal multiplication with the switching signal, which includes a word width of only one bit, so that hardware expenditure is minimal and can be realised with the aid of a simple multiplexer 52. Furthermore, the resolution of the second analog-digital converter 32 which provides a digital signal from the supply voltage 30, need not be particularly high because noise in the modulator negative feedback 50 are suppressed at this point by the negative feedback connection 20, Instead of a FPGA the amplifier according to the present invention may alternatively be implemented with the aid of an ASIC, wherein the switching components assigned to the FPGA in the above description are then digitally realised in the ASIC.

The amplifier according to the invention is however not limited to the above described exemplary embodiment. A further possibility of adapting the loop gain $A_S$ consists in a signal multiplication in the negative feedback connection 20. However this would change the overall gain $A_G$, so that an additional corresponding signal adaptation is necessary in the signal path 10 outside the loop 42, which only affects the forward gain $A_V$, but not the loop gain $A_S$. Thus using two adaptations at different points in the amplifier both the loop gain $A_S$ and the overall gain $A_G$ can be kept constant, at least approximately, for a variation in the supply voltage 30 applied to the switched output stage 16.

Another possibility is a signal division in forward direction of the signal path 10 within the loop 42. The word width of the signal to be divided is however comparatively high so that the necessary hardware expenditure compared to the preferred embodiment is high.

Although a preferred embodiment has been disclosed and described in the drawings and in the above description, this should be regarded merely as an example and not as restricting the invention. It is pointed out that only the preferred embodiment has been illustrated in detail and described, and that changes and modifications which at present and in the future lie within the scope of the invention should be protected. The features shown may be of importance in random combinations.

LIST OF REFERENCE SYMBOLS 8 amplifier
10 signal path
12 digital loop filter
14 digital sigma-delta-modulator
16 switched output stage
18 filter
20 negative feedback connection
22 analog loop filter
24 first analog-digital converter
25 digital filter
26 digital-analog negative feedback connection
28 digital-analog converter
30 variable supply voltage
32 second analog-digital converter
34 digital input
36 output signal
38 hardware-programmable component
40 clock source
42 loop
44 first integrator
46 second integrator
48 quantizer
50 modulator negative feedback connection
52 multiplexer
54 delay element
56 integrator saturation 57 adder
58 integrator feedback
60 integration coefficient
62 saturation value

The invention claimed is:

1. An amplifier for amplifying an input signal to an output signal, wherein the amplifier comprises:
 a signal path comprising:
  a modulator suitable for receiving the input signal and for generating a switching signal in response to the received input signal;
  a switched output stage connected with a supply voltage, wherein the switched output stage comprises a switch which is switched according to the switching signal generated by the modulator, and the switched output stage generates an output signal, the amplitude of which is dependent on the supply voltage; and
  a modulator negative feedback connection which is suitable for feeding back the switching signal to an input of the modulator in order to be combined with the signal at the input of the modulator; and
  a compensator, which receives the supply voltage of the switched output stage or a signal derived therefrom; and
 a negative feedback connection that is in communication with the signal path such that the signal path and the negative feedback connection form a loop with a loop gain, wherein the negative feedback connection is suitable for feeding back the output signal generated by the switched output stage to an input of the amplifier, wherein the fed-back output signal is combined with the input signal; and
 wherein the compensator is suitable for compensating, at least partially, for changes in the loop gain resulting from a variation in the supply voltage, wherein the compensator is suitable for amplifying or reducing the signal in the signal path of the loop in dependence of the supply voltage in such a way as to counteract a change in loop gain based on the variation in the supply voltage, and wherein the compensator is suitable for amplifying or reducing the signal on the modulator negative feedback connection in dependence of the supply voltage in such a way as to counteract a change in loop gain based on the variation in the supply voltage.

2. The amplifier according to claim 1, further comprising means for varying the supply voltage in dependence of the input signal.

3. The amplifier according to claim 1, wherein the compensator is suitable for multiplying the supply voltage of the switched output stage or a signal derived therefrom with the signal on the modulator negative feedback connection.

4. The amplifier according to claim 3, wherein the compensator comprises a multiplexer and wherein the supply voltage of the switched output stage or a signal derived therefrom are multiplied by the multiplexer with the switching signal so as to form a signal, which at least approximately has the value or inverted value of the supply voltage or at least approximately has the value or inverted value of a signal derived from the supply voltage.

5. The amplifier according to claim 4, wherein the modulator comprises a sigma-delta modulator, wherein the sigma-delta modulator preferably comprises a loop filter with two or more integrators.

6. The amplifier according to claim 5, wherein the loop filter can assume states which are influenced by at least one state variable for which the loop filter comprises a limit value, wherein the compensator is suitable for correspondingly adapting the limit value in response to the variation in the supply voltage.

7. The amplifier according to claim 5, wherein the sigma-delta modulator is implemented on a hardware-programmable component, in particular on a FPGA.

8. The amplifier according to claim 7, additionally comprising a digital loop filter arranged in the signal path upstream of the sigma-delta modulator, wherein the digital loop filter receives and amplifies a signal that is based on the output signal and is generated by combining the input signal with the fed-back output signal, which has been fed-back by the negative feedback connection, wherein the digital loop filter is implemented on the hardware-programmable component, in particular on the FPGA.

9. The amplifier according to claim 7, wherein the negative feedback connection further comprises:
 an analog-loop filter, and
 an analog-digital converter of the second order the input of which is connected with an output of the analog loop filter.

10. The amplifier according to claim 9, further comprising:
 a digital-analog negative feedback connection which is suitable for feeding back the output signal of the analog-digital converter in order to be combined with the fed-back the output signal of the switched output stage, and
 a digital-analog converter which is suitable for converting a signal based on an output signal of the analog-digital converter into an analog signal.

11. The amplifier according to claim 10, further comprising a digital filter the input of which is connected with the output of the analog-digital converter, wherein the digital-analog negative feedback connection is suitable for feeding back an output signal of the digital filter in order to be combined with the fed-back output signal of the switched output stage.

12. The amplifier according to claim 1, further comprising a filter the input of which is connected with the output of the switched output stage, wherein the negative feedback connection is suitable for feeding back the output signal of the switched output stage upstream or downstream of the filter.

13. The amplifier according to claim 7, additionally comprising an analog-digital converter which is suitable for converting the supply voltage into a digital signal and to forward this to the compensator.

14. The amplifier according to claim 1, which is arranged for operation with a supply voltage, which is connected externally.

15. The amplifier according to claim 1, wherein the switched output stage is formed by an H-bridge and/or wherein the switch is formed by power MOSFET transistors.

16. The amplifier according to claim 9, additionally comprising a clock source for digital signal processing and/or for digital signal generating, wherein the analog-digital converter is arranged for operation at a sampling frequency comprising $\geq 100$ kHz, preferably $\geq 1$ MHz, especially preferably $\geq 10$ MHz.

17. An amplifier for amplifying an input signal to an output signal, wherein the amplifier comprises:
 a signal path comprising:
  a modulator suitable for receiving the input signal and for generating a switching signal in response to the received input signal;

a switched output stage connected with a supply voltage, wherein the switched output stage comprises a switch which is switched according to the switching signal generated by the modulator, and the switched output stage generates an output signal, the amplitude of which is dependent on the supply voltage; and a compensator, which receives the supply voltage of the switched output stage or a signal derived therefrom, and a negative feedback connection that is in communication with the signal path such that the signal path and the negative feedback connection form a loop with a loop gain, wherein the negative feedback connection is suitable for feeding back the output signal generated by the switched output stage to an input of the amplifier, wherein the fed-back output signal is combined with the input signal; and wherein the compensator is suitable for compensating, at least partially, for changes in the loop gain resulting from a variation in the supply voltage, wherein the compensator is suitable for amplifying or reducing the signal in the signal path of the loop in dependence of the supply voltage in such a way as to counteract a change in loop gain based on the variation in the supply voltage, and wherein the compensator is suitable for dividing the signal on the signal path by the supply voltage of the switched output stage or with a signal derived therefrom.

18. A method for amplifying an input signal to an output signal with the aid of an amplifier comprising a signal path and a negative feedback connection, which form a loop with a loop gain, wherein the method comprises:

receiving the input signal;

generating a switching signal with the aid of a modulator;

generating an output signal with the aid of a switched output stage connected with a supply voltage, wherein the switched output stage includes a switch which is switched according to the switching signal generated by the modulator, wherein the amplitude of the output signal depends on the supply voltage;

feeding back the output signal of the switched output stage with the aid of the negative feedback connection;

combining the fed-back output signal with the input signal;

feeding back the switching signal to an input of the modulator via a modulator negative feedback connection in order to be combined with the signal at the input of the modulator;

compensating, at least partially, for changes in the loop gain resulting from a variation in the supply voltage by using a compensator, wherein the compensator receives the supply voltage of the switched output stage or a signal derived therefrom. wherein the compensating comprises:

amplifying or reducing the signal in the signal path of the loop in dependence of the supply voltage in such a way as to counteract a change in loop gain based on the variation in the supply voltage by amplifying or reducing the signal on the modulator negative feedback connection in dependence of the supply voltage in such a way as to counteract a change in loop gain based on the variation in the supply voltage.

19. A method for amplifying an input signal to an output signal with the aid of an amplifier comprising a signal path and a negative feedback connection, which form a loop with a loop gain, wherein the method comprises:

receiving the input signal;

generating a switching signal with the aid of a modulator;

generating an output signal with the aid of a switched output stage connected with a supply voltage, wherein the switched output stage includes a switch which is switched according to the switching signal generated by the modulator, wherein the amplitude of the output signal depends on the supply voltage;

feeding back the output signal of the switched output stage with the aid of the negative feedback connection;

combining the fed-back output signal with the input signal;

compensating, at least partially, for changes in the loop gain resulting from a variation in the supply voltage by using a compensator, wherein the compensator receives the supply voltage of the switched output stage or a signal derived therefrom, wherein the compensating comprises:

amplifying or reducing the signal in the signal path of the loop in dependence of the supply voltage in such a way as to counteract a change in loop gain based on the variation in the supply voltage by dividing the signal on the signal path by the supply voltage of the switched output stage or with a signal derived therefrom.

* * * * *